(12) United States Patent
Fukui et al.

(10) Patent No.: US 11,817,310 B2
(45) Date of Patent: Nov. 14, 2023

(54) BEVEL PORTION TREATMENT AGENT COMPOSITION AND METHOD OF MANUFACTURING WAFER

(71) Applicant: CENTRAL GLASS COMPANY, LIMITED, Ube (JP)

(72) Inventors: Yuki Fukui, Ube (JP); Yuzo Okumura, Ube (JP); Yoshiharu Terui, Ube (JP); Soichi Kumon, Ube (JP)

(73) Assignee: CENTRAL GLASS COMPANY, LIMITED, Yamaguchi (JP)

( * ) Notice: Subject to any disclaimer, the term of this patent is extended or adjusted under 35 U.S.C. 154(b) by 170 days.

(21) Appl. No.: 17/295,739

(22) PCT Filed: Oct. 21, 2019

(86) PCT No.: PCT/JP2019/041349
§ 371 (c)(1),
(2) Date: May 20, 2021

(87) PCT Pub. No.: WO2020/105340
PCT Pub. Date: May 28, 2020

(65) Prior Publication Data
US 2022/0020582 A1 Jan. 20, 2022

(30) Foreign Application Priority Data

Nov. 22, 2018 (JP) .................. 2018-218942

(51) Int. Cl.
*H01L 21/02* (2006.01)
*C07F 7/18* (2006.01)
(Continued)

(52) U.S. Cl.
CPC ...... *H01L 21/02057* (2013.01); *C07F 7/0812* (2013.01); *C07F 7/188* (2013.01);
(Continued)

(58) Field of Classification Search
CPC ......... H01L 21/02057; H01L 21/02087; H01L 21/02334; H01L 21/02068; C07F 7/0812;
(Continued)

(56) References Cited

U.S. PATENT DOCUMENTS 8,851,092 B2 10/2014 Yamamoto et al.
9,120,120 B2 9/2015 Yamamoto et al.
(Continued)

FOREIGN PATENT DOCUMENTS

JP 2005-340554 12/2005
JP 2008-277748 11/2008
(Continued)

OTHER PUBLICATIONS

Akamatsu Y, WO-2011155407-A1, Machine Translation. (Year: 2022).*
(Continued)

*Primary Examiner* — Duy Vu N Deo
*Assistant Examiner* — Christopher Remavege
(74) *Attorney, Agent, or Firm* — Hamre, Schumann, Mueller & Larson, P.C.

(57) ABSTRACT

A bevel portion treatment agent composition of the present invention is a bevel portion treatment agent composition containing a silylating agent, which is used for treating a bevel portion of a wafer, in which a surface modification index Y and a surface modification index Z measured by a predetermined procedure have a characteristic of satisfying $0.5 \leq Y/Z \leq 1.0$.

5 Claims, 5 Drawing Sheets

(51) Int. Cl.
*C07F 7/08* (2006.01)
*C11D 7/08* (2006.01)
*C11D 7/26* (2006.01)

(52) U.S. Cl.
CPC ................ *C11D 7/08* (2013.01); *C11D 7/261* (2013.01); *H01L 21/02087* (2013.01); *H01L 21/02334* (2013.01)

(58) Field of Classification Search
CPC ........... C07F 7/188; C11D 7/08; C11D 7/261; C11D 11/0047; C11D 11/0064; C11D 7/28; C11D 7/22; C11D 7/32; C11D 7/34
See application file for complete search history.

(56) References Cited

U.S. PATENT DOCUMENTS

| | | | |
|---|---|---|---|
| 9,244,358 B2 * | 1/2016 | Koshiyama | C09K 3/18 |
| 9,259,758 B2 | 2/2016 | Emoto et al. | |
| 10,093,815 B2 * | 10/2018 | Mori | H01L 21/306 |
| 10,593,538 B2 * | 3/2020 | Wojtczak | H01L 21/321 |
| 2008/0241489 A1 | 10/2008 | Ishibashi et al. | |
| 2009/0202951 A1 | 8/2009 | Yamamoto et al. | |
| 2014/0065295 A1 | 3/2014 | Emoto et al. | |
| 2014/0352736 A1 | 12/2014 | Yamamoto et al. | |

FOREIGN PATENT DOCUMENTS

| | | | | |
|---|---|---|---|---|
| JP | 2009-194034 | | 8/2009 | |
| JP | 2009-218249 | | 9/2009 | |
| JP | 2012-015335 | | 1/2012 | |
| JP | 2014-197571 | | 10/2014 | |
| JP | 2016106414 A | * | 6/2016 | ....... H01L 21/02057 |
| JP | 7252478 B2 | * | 4/2023 | ........... B08B 7/0014 |
| WO | WO-2009104748 A1 | * | 8/2009 | ................ G03F 7/11 |
| WO | WO-2011155407 A1 | * | 12/2011 | ................ B08B 3/08 |
| WO | WO-2012090779 A1 | * | 7/2012 | ......... C11D 11/0047 |
| WO | WO-2013080822 A1 | * | 6/2013 | ................ C09D 5/00 |

OTHER PUBLICATIONS

Akamatsu Y, WO-2012090779-A1, Machine Translation. (Year: 2022).*
Arata, WO-2013080822-A1, Machine Translation. (Year: 2022).*
Akamatsu Y, JP-2016106414-A, Machine Translation. (Year: 2022).*
Hagiwara, WO-2009104748-A1, Machine Translation. (Year: 2023).*
Terui, JP-7252478-B2, Machine Translation. (Year: 2023).*
International Search Report of PCT/JP2019/041349, dated Jan. 21, 2020, 1 page.
Decision to Grant a Patent issued for Japanese Patent Application No. 2020-558176, dated Jul. 4, 2023, 6 pages including machine translation.

* cited by examiner

BEVEL PORTION TREATMENT AGENT COMPOSITION AND METHOD OF MANUFACTURING WAFER

TECHNICAL FIELD

The present invention relates to a bevel portion treatment agent composition and a method of manufacturing a wafer.

BACKGROUND ART

So far, various studies have been made on the cleaning technology for a bevel portion of a semiconductor wafer. As a technology of this kind, for example, the technology disclosed in Patent Document 1 is known. Patent Document 1 describes a method of cleaning a surface of a bevel portion by ejecting a chemical solution from a chemical solution nozzle to a surface of a semiconductor wafer and spreading the cleaning chemical solution to the outside of the bevel portion by a centrifugal force of rotation. (paragraph 0025 and FIG. 3 of Patent Document 1).

In addition, in each step of semiconductor manufacturing, it is known that metal contamination or the like occurs on a back surface of the wafer, which is a portion other than a device surface of the semiconductor wafer, and a surface of the bevel portion (wafer edge portion and peripheral portion) (paragraph 0004 of Patent Document 2).

RELATED DOCUMENT

Patent Document

[Patent Document 1] Japanese Unexamined Patent Publication No. 2009-218249
[Patent Document 2] Japanese Unexamined Patent Publication No. 2005-340554

SUMMARY OF THE INVENTION

As a result of the examination by the present inventors, it has been found that there is room for improvement in the chemical solution disclosed in Patent Document 1 in terms of property of preventing adhesion of foreign substances.

In the manufacturing process of forming a semiconductor element on a semiconductor wafer, it is known that foreign substances such as metal particles adhere to a bevel portion located at an end portion of the semiconductor wafer. If foreign substances adhering to the surface of the bevel portion diffuses into an element forming region of itself or another semiconductor wafer in various steps such as transporting, storing, and processing the semiconductor wafer, there is a concern that the device characteristics of a semiconductor chip deteriorate.

As described above, a method of cleaning foreign substances on the surface of the bevel portion with a cleaning chemical solution is adopted. However, there is a concern that foreign substances adhere again to the surface of the bevel portion after cleaning.

Therefore, the present inventors considered that the adhesion property of foreign substances can be controlled by modifying the surface of the bevel portion, focused on a modification step on the surface of the bevel portion, and proceeded an examination on a chemical solution suitable for the modification step, that is, a bevel portion treatment agent composition.

As a result of intensive examination, it was found that the adhesion property of foreign substances on the surface of the bevel portion can be appropriately controlled by using critical surface tension after treatment with a bevel portion treatment agent composition as a guideline.

In addition, it is generally known that a plurality of types of insulating films such as a silicon oxide film and a silicon nitride film are laminated on the surface of the bevel portion, and a film in a state in which different materials are mixed is exposed. As a result of the examination based on such circumstances, it was found that the adhesion property of foreign substances on the surface of the bevel portion can be stably evaluated by using the two critical surface tensions for films of different materials as guidelines.

As a result of further intensive examination based on such findings, it was found that adhesion prevention ability of foreign substances such as metal particles on the surface of the bevel portion is improved by using a ratio of critical surface tension Y to the silicon oxide film and critical surface tension Z to the silicon nitride film was used as an index, and performing modification using a bevel portion treatment agent composition in which the index "Y/Z" was appropriately controlled, thereby completing the invention.

According to the present invention, there is provided a bevel portion treatment agent composition containing a silylating agent, which is used for treating a bevel portion of a wafer,
in which a surface modification index Y and a surface modification index Z measured by the following procedures (1) to (4) satisfy $0.5 \leq Y/Z \leq 1.0$ Procedure (1) A substrate having a silicon oxide film ($SiO_2$ film) having a thickness of 1 μm on the surface is treated with the bevel portion treatment agent composition. The treatment conditions are as follows: the substrate is immersed in a 1% by mass hydrofluoric acid aqueous solution at room temperature for 10 minutes, subsequently, immersed in pure water for 1 minute, and in 2-propanol (iPA) for 1 minute, subsequently, immersed in the bevel portion treatment agent composition at 25° C. for 1 minute, subsequently, immersed in iPA for 1 minute, finally, the substrate is removed from iPA, and air is blown to remove iPA on the surface of the substrate.

(2) The critical surface tension of the silicon oxide film after the treatment (1) is obtained by a Zisman plot method using a plurality of measuring liquids having different mixing ratios of water and iPA. A value of the obtained critical surface tension (mN/m) is defined as the "surface modification index Y".

(3) A substrate having a silicon nitride film (SiN film) having a thickness of 50 nm on the surface is treated with the bevel portion treatment agent composition. The treatment conditions are as follows: the substrate is immersed in a 1% by mass hydrofluoric acid aqueous solution at room temperature for 10 minutes, subsequently, immersed in pure water for 1 minute, and in iPA for 1 minute, subsequently, immersed in the bevel portion treatment agent composition at 25° C. for 1 minute, subsequently, immersed in iPA for 1 minute, finally, the substrate is removed from iPA, and air is blown to remove iPA on the surface of the substrate.

(4) The critical surface tension of the silicon nitride film after the treatment (3) is obtained by the Zisman plot method using a plurality of measuring liquids having different mixing ratios of water and iPA. A value of the obtained critical surface tension (mN/m) is defined as the "surface modification index Z".

In addition, according to the present invention, there is provided a method of manufacturing a wafer, the method including:
a wafer surface modification step; and
a wafer processing step,
in which in the surface modification step, the bevel portion treatment agent composition is used.

According to the present invention, there is provided a bevel portion treatment agent composition having excellent property of preventing adhesion of foreign substances, and a method of manufacturing a wafer using thereof.

DESCRIPTION OF EMBODIMENTS

Hereinafter, embodiments of the present invention will be described with reference to the drawings. In all the drawings, the same constituents will be referred to with the same numerals, and the description thereof will not be repeated. In addition, the figure is a schematic view and does not match the actual dimensional ratio.

The outline of the bevel portion treatment agent composition of the present embodiment will be described.

The bevel portion treatment agent composition of the present embodiment is a surface modifier used for treating the bevel portion of a wafer. The bevel portion treatment agent composition contains a silylating agent, and "Y/Z" represented by the surface modification index Y and the surface modification index Z measured in the following procedures (1) to (4) has characteristics of satisfying Formula (I).

$$0.5 \leq Y/Z \leq 1.0 \quad (I)$$

Procedure (1) A substrate having a silicon oxide film (thermal oxide film) having a thickness of 1 μm on the surface is treated with the bevel portion treatment agent composition. The treatment conditions are as follows: the substrate is immersed in a 1% by mass hydrofluoric acid aqueous solution at room temperature for 10 minutes, subsequently, immersed in pure water for 1 minute, and in 2-propanol (iPA) for 1 minute, subsequently, immersed in the bevel portion treatment agent composition at 25° C. for 1 minute, subsequently, immersed in iPA for 1 minute, finally, the substrate is removed from iPA, and air is blown to remove iPA on the surface of the substrate.

(2) The critical surface tension of the silicon oxide film after the treatment (1) is obtained by a Zisman plot method using a plurality of measuring liquids having different mixing ratios of water and iPA. A value of the obtained critical surface tension (mN/m) is defined as the "surface modification index Y".

(3) A substrate having a silicon nitride film (LP-CVD film) having a thickness of 50 nm on the surface is treated with the bevel portion treatment agent composition. The treatment conditions are as follows: the substrate is immersed in a 1% by mass hydrofluoric acid aqueous solution at room temperature for 10 minutes, subsequently, immersed in pure water for 1 minute, and in iPA for 1 minute, subsequently, immersed in the bevel portion treatment agent composition at 25° C. for 1 minute, subsequently, immersed in iPA for 1 minute, finally, the substrate is removed from iPA, and air is blown to remove iPA on the surface of the substrate.

(4) The critical surface tension of the silicon nitride film after the treatment (3) is obtained by the Zisman plot method using a plurality of measuring liquids having different mixing ratios of water and iPA. A value of the obtained critical surface tension (mN/m) is defined as the "surface modification index Z".

Figure 1:
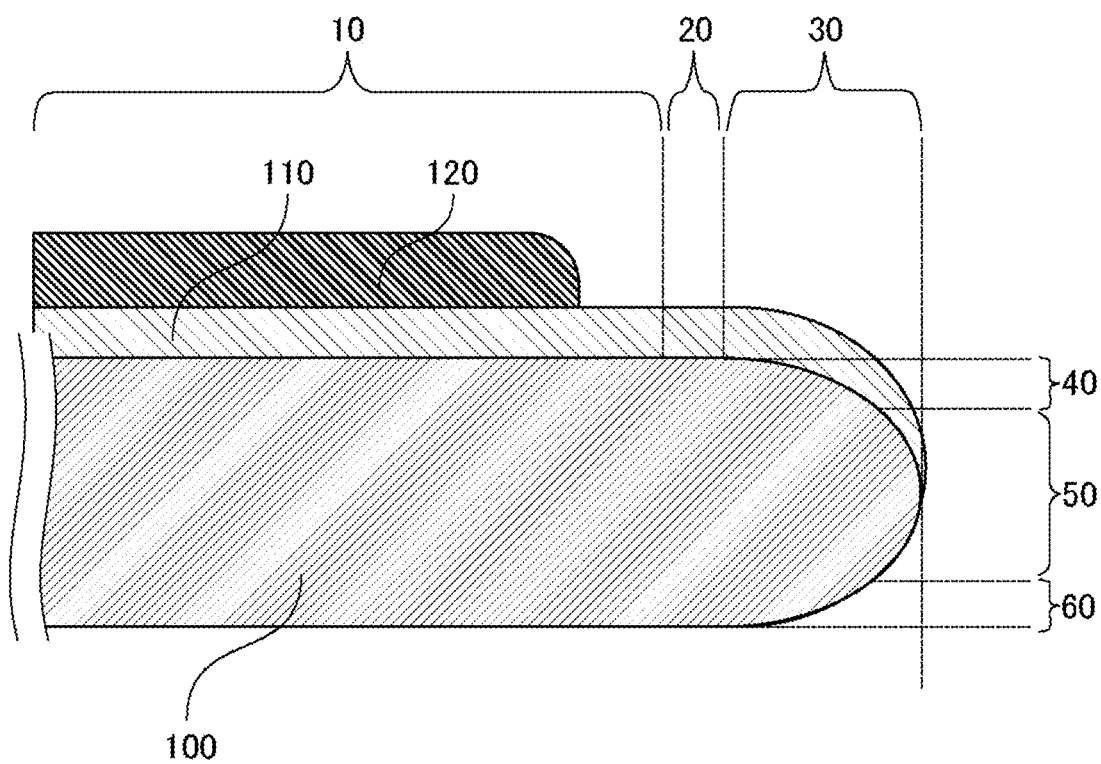
FIG. 1 is a cross-sectional view schematically showing a configuration of a bevel portion of a wafer according to the present embodiment.

FIG. 1 is a cross-sectional view schematically showing a configuration of a bevel portion 30 of a wafer 100.

An example of the wafer 100 of the present embodiment has the bevel portion 30 formed outside an element forming region 10. The bevel portion 30 has an upper bevel portion 40 formed of an inclined surface, a lower bevel portion 60, and an edge portion 50 formed of an end surface of an edge.

As shown in FIG. 1, in a film forming process of a film constituting a semiconductor element in the element forming region 10, an insulating film 110 such as a silicon oxide film or a silicon nitride film is formed on a surface of the upper bevel portion 40 or the edge portion 50 in the bevel portion 30. The insulating film 110 is a heterogenous film that is exposed on the surface of the bevel portion 30 in a state where a plurality of heterogenous materials is mixed. Then, in various steps of the wafer 100, foreign substances (particles) such as metal particles and inorganic particles adhere to the insulating film 110 in the bevel portion 30.

According to the findings of the present inventors, it has been found that the adhesion property of foreign substances on the surface of the bevel portion 30 can be appropriately controlled by using the critical surface tension after treatment with the bevel portion treatment agent composition as a guideline.

In addition, it was recognized that by using a ratio of the critical surface tension to each of the silicon oxide film and the silicon nitride film, which are typical examples of heterogenous films exposed on the surface of the bevel portion 30, as a guideline, adhesion property of foreign substances in the bevel portion 30 can be stably evaluated.

In addition, the present inventors proceeded examination on a method of measuring critical surface tension using the Zisman plot method. As a result, it was determined that under the conditions of the Zisman plot method, using a plurality of liquids having different mixing ratios of water and iPA, as measuring liquids, the critical surface tension of the silicon oxide film and the silicon nitride film can be appropriately evaluated.

As the measuring liquid, two or more selected from liquids in which the mixing ratio of water and iPA is 100:0, 99:1, 95:5, 87:13, 80:20, 66:34, 60:40, 50:50, 40:60, 30:70, 20:80, 10:90, 5:95, 3:97, and 0:100 in terms of mass ratio can be used. It was recognized that the critical surface tension can be calculated from the Zisman plot by appropriately selecting two or three or more kinds of measuring liquids.

As a result of further intensive examination based on such findings, it was found that in a case where the critical surface tension for the silicon oxide film obtained by the Zisman plot method was defined as the "surface modification index Y", and the critical surface tension for the silicon nitride film obtained by the Zisman plot method was defined as the "surface modification index Z", the "Y/Z" is adopted as an index, and the ability of preventing adhesion of foreign substances is improved by modifying the surface of the bevel portion 30 by using a bevel portion treatment agent composition in which such an index is controlled within an appropriate numerical value range.

Although the detailed mechanism is not clear, in the bevel portion treatment agent composition in which the index "Y/Z" is appropriately controlled, even if variation in the materials occurs in the film such as the insulating film 110 formed on the surface of the bevel portion 30, it is considered that the surface modifying ability can be stably exhibited for these heterogenous mixed films, and thus the property of preventing adhesion of foreign substances in the bevel portion 30 is enhanced.

Since the bevel portion treatment agent composition of the present embodiment can suppress adhesion of foreign substances on the surface of the bevel portion 30, the bevel portion treatment agent composition can be suitably used for the modification step on the surface of the bevel portion 30. By treating the bevel portion 30 with the bevel portion treatment agent composition of the present embodiment, contamination caused by foreign substances derived from the bevel portion can be suppressed in the semiconductor manufacturing process, and thus the manufacturing stability and the manufacturing yield of the semiconductor element can be improved. In addition, it is possible to realize a semiconductor element having excellent device characteristics.

The characteristics of the bevel portion treatment agent composition of the present embodiment will be described.

In the bevel portion treatment agent composition, "Y/Z" represented by the surface modification index Y and the surface modification index Z measured in the procedures (1) to (4) has a characteristic of satisfying Formula (I).

$$0.5 \leq Y/Z \leq 1.0 \tag{I}$$

A lower limit value of Y/Z is, for example, equal to or more than 0.50, preferably equal to or more than 0.60, and more preferably equal to or more than 0.70. As a result, the surface modification ability can be stably exhibited. On the other hand, an upper limit value of Y/Z is, for example, equal to or less than 1.00, preferably equal to or less than 9.98, and more preferably equal to or less than 9.95. As a result, the ability of preventing adhesion of foreign substances can be enhanced.

The bevel portion treatment agent composition can have a characteristic of satisfying 15 mN/m≤Y≤26 mN/m.

The surface modification index Y is, for example, 15 mN/m to 26 mN/m, preferably 20 mN/m to 25 mN/m, and more preferably 20 mN/m to 24 mN/m. By setting the surface modification index Y within the numerical value range, in a case where a silicon wafer is used as the wafer 100, it is possible to enhance the ability of preventing adhesion of foreign substances on the surface of the bevel portion on which a natural oxide film is formed.

In the present embodiment, the Y/Z and Y are controlled by appropriately selecting the type or the blending amount of each component contained in the bevel portion treatment agent composition, a preparation method of the bevel portion treatment agent composition, and the like. Among these, for example, a matter that the composition is used promptly after mixing raw materials and preparing the bevel portion treatment agent composition, a matter that a concentration or a liquid temperature of the silylating agent in the bevel portion treatment agent composition is appropriately adjusted, and the like are exemplified as elements for setting the Y/Z and Y to be in a desired numerical value range.

A method of manufacturing a wafer using the bevel portion treatment agent composition of the present embodiment will be described.

The method of manufacturing a wafer of the present embodiment includes a wafer surface modification step and a wafer processing step. Then, in the surface modification step, the bevel portion treatment agent composition of the present embodiment is used.

As shown in FIG. 1, the bevel portion treatment agent composition of the present embodiment can enhance the ability of preventing adhesion of foreign substances to the surface of the bevel portion 30 of the wafer 100. By modifying the surface of the bevel portion 30 in this way, it is possible to suppress foreign substance contamination of the bevel portion 30 in the semiconductor manufacturing process, and it is possible to suppress secondary contamination caused by foreign substances adhering to the bevel portion 30. Therefore, it is possible to improve the manufacturing stability or the manufacturing yield of the semiconductor element.

Examples of the wafer 100 include silicon wafers, SiC wafers, sapphire wafers, and compound semiconductor wafers.

The wafer 100 includes an element forming region 10 on which a semiconductor element is formed, a peripheral cut region 20 for dicing provided outside the element forming region 10, and a bevel portion 30 provided outside the peripheral cut region 20.

The processing steps of the wafer 100 include various steps of forming semiconductor elements such as a step of forming a fine pattern having an uneven shape in the element forming region 10, a step of dicing or grinding the wafer 100, a step of forming various films such as an insulating film 110 and a metal film 120, and a step of cleaning the wafer 100.

In the surface modification step of the wafer 100, the coating method is not particularly limited as long as the bevel portion treatment agent composition of the present embodiment can be applied to the bevel portion 30.

The surface modification step of the wafer 100 may be performed before and after the processing step and between each of a plurality of steps during the processing step. The surface modification step may be carried out one time or two times or more. Among these, it is expected that the contamination of the bevel portion 30 and the secondary contamination from the bevel portion 30 can be suppressed in the subsequent processing steps by performing the surface modification step between the processing steps.

Subsequently, components of the bevel portion treatment agent composition of the present embodiment will be described.

The bevel portion treatment agent composition of the present embodiment contains a silylating agent.

As the silylating agent, a known silylating agent can be used. As the silylating agent, for example, a silicon compound represented by General Formula [1] is used.

These may be used alone or in combination of two or more.

$$R^1{}_a Si(H)_b X_{4-a-b} \quad [1]$$

In General Formula [1], $R^1$ each independently is an organic group containing a hydrocarbon group having 1 to 18 carbon atoms, in which part or all of hydrogen elements may be substituted with fluorine elements, X each independently is a monovalent organic group in which the element bonded to the Si element is nitrogen, oxygen, carbon, or halogen, a is an integer of 1 to 3, b is an integer of 0 to 2, and the sum of a and b is 1 to 3.

$R^1$ in General Formula [1] may contain not only hydrogen, carbon, nitrogen, oxygen, and fluorine elements, but also silicon, sulfur, halogen elements (other than fluorine), and the like.

Examples of $R^1$ in General Formula [1] include at least one group, each independently, selected from $C_e H_{2e+1}$ (e=1 to 18), and $C_f F_{2f+1} CH_2 CH_2$ (f=1 to 8). Among these, a silicon compound having a trialkylsilyl group can be used. In addition, $R^1$ may contain an unsaturated bond or an aromatic ring.

In a case where $R^1$ in General Formula [1] contains a silicon element, a structure of General Formula [1-1] shown below may be adopted.

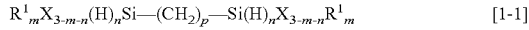

$$R^1{}_m X_{3-m-n}(H)_n Si-(CH_2)_p-Si(H)_n X_{3-m-n} R^1{}_m \quad [1-1]$$

In General Formula [1-1], $R^1$ (here, silicon element is not contained in $R^1$) and X are the same as those in General Formula [1], m is an integer of 1 to 2, n is an integer of 0 to 1, the sum of m and n is 1 to 2, p is an integer of 1 to 18, and a methylene chain represented by $-(CH_2)_p-$ may be halogen-substituted.

In X in General Formula [1], the monovalent organic group in which the element bonded to the Si element is nitrogen, oxygen or carbon may include not only hydrogen, carbon, nitrogen and oxygen elements but also silicon, sulfur and halogen elements.

Examples of monovalent organic groups in which the element bonded to the Si element is nitrogen include an isocyanate group, an amino group, a dialkylamino group, an isothiocyanate group, an azide group, an acetamide group, and $-NHC(=O)CF_3$, $-N(CH_3)C(=O)CH_3$, $-N(CH_3)C(=O)CF_3$, $-N=C(CH_3)OSi(CH_3)_3$, $-N=C(CF_3)OSi(CH_3)_3$, $-NHC(=O)-OSi(CH_3)_3$, $-NHC(=O)-NH-Si(CH_3)_3$, imidazole ring, triazole ring, tetrazole ring, oxazolidinone ring, morpholine ring, $-NH-C(=O)-Si(CH_3)_3$, $-N(H)_{2-g}(Si(H)_n R^3{}_{3-h})_g$ ($R^3$ is a monovalent hydrocarbon group having 1 to 18 carbon atoms in which part or all of hydrogen elements may be substituted with fluorine elements, g is 1 or 2, h is an integer of 0 to 2), $-N(S(=O)_2 R^4)_2$ (here, $R^4$ each independently is a group selected from the group consisting of a monovalent hydrocarbon group having 1 to 8 carbon atoms in which part or all of hydrogen elements may be substituted with fluorine elements, and a fluorine element), and a substituent having a structure of General Formula [1-2]

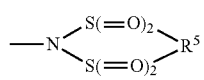

[1-2]

(In General Formula [1-2], $R^5$ each independently is a divalent hydrocarbon group having 1 to 8 carbon atoms in which part or all of the hydrogen elements may be substituted with fluorine elements), $-N=C(NR^6{}_2)_2$, $-N=C(NR^6{}_2)R^6$ (here, $R^6$ each independently is selected from a hydrogen group, a $-C\equiv N$ group, a $-NO_2$ group, and a hydrocarbon group in which part or all of hydrogen elements may be substituted with fluorine elements, and the hydrocarbon group may have an oxygen atom and/or a nitrogen atom), $-N(R^{a1})R^{a2}$ (here, $R^{a1}$ represents a hydrogen atom, or a saturated or unsaturated alkyl group, and $R^{a2}$ is a saturated or unsaturated alkyl group, a saturated or unsaturated cycloalkyl group, or a saturated or unsaturated heterocycloalkyl group. $R^{a1}$ and $R^{a2}$ may be bonded to each other to form a saturated or unsaturated heterocycloalkyl group having a nitrogen atom), $-N(R^{a3})-Si(R^{a4})(R^{a5})(R^{a6})$ (here, $R^{a1}$ represents a hydrogen atom, a methyl group, a trimethylsilyl group, or a dimethylsilyl group, $R^{a4}$, $R^{a5}$ and $R^{a6}$ each independently represent a hydrogen atom or an organic group, the total number of carbon atoms contained in $R^{a4}$, $R^{a5}$ and $R^{a6}$ is equal to or more than 1), $-N(R^{a7})-C(=O)R^{a8}$ (here, $R^{a7}$ represents a hydrogen atom, a methyl group, a trimethylsilyl group, or a dimethylsilyl group, and $R^{a8}$ is a hydrogen atom, a saturated or unsaturated alkyl group, or a fluorine-containing alkyl group, or a trialkylsilylamino group), and the like.

Examples of the silylating agent in which X in General Formula [1] is a monovalent organic group in which the element bonded to the Si element is nitrogen include $CH_3Si(NH_2)_3$, $C_2H_5Si(NH_2)_3$, $C_3H_7Si(NH_2)_3$, $C_4H_9Si(NH_2)_3$, $C_5H_{11}Si(NH_2)_3$, $C_6H_{13}Si(NH_2)_3$, $C_7H_{15}Si(NH_2)_3$, $C_8H_{17}Si(NH_2)_3$, $C_9H_{19}Si(NH_2)_3$, $C_{10}H_{21}Si(NH_2)_3$, $C_{11}H_{23}Si(NH_2)_3$, $C_{12}H_{25}Si(NH_2)_3$, $C_{13}H_{27}Si(NH_2)_3$, $C_{14}H_{29}Si(NH_2)_3$, $C_{15}H_{31}Si(NH_2)_3$, $C_{16}H_{33}Si(NH_2)_3$, $C_{17}H_{35}Si(NH_2)_3$, $C_{18}H_{37}Si(NH_2)_3$, $(CH_3)_2Si(NH_2)_2$, $C_2H_5Si(CH_3)(NH_2)_2$, $(C_2H_5)_2Si(NH_2)_2$, $C_3H_7Si(CH_3)(NH_2)_2$, $(C_3H_7)_2Si(NH_2)_2$, $C_4H_9Si(CH_3)(NH_2)_2$, $(C_4H_9)_2Si(NH_2)_2$, $C_5H_{11}Si(CH_3)(NH_2)_2$, $C_6H_{13}Si(CH_3)(NH_2)_2$, $C_7H_{15}Si(CH_3)(NH_2)_2$, $C_8H_{17}Si(CH_3)(NH_2)_2$, $C_9H_{19}Si(CH_3)(NH_2)_2$, $C_{10}H_{21}Si(CH_3)(NH_2)_2$, $C_{11}H_{23}Si(CH_3)(NH_2)_2$, $C_{12}H_{25}Si(CH_3)(NH_2)_2$, $C_{13}H_{27}Si(CH_3)(NH_2)_2$, $C_{14}H_{29}Si(CH_3)(NH_2)_2$, $C_{15}H_{31}Si(CH_3)(NH_2)_2$, $C_{16}H_{33}Si(CH_3)(NH_2)_2$, $C_{17}H_{35}Si(CH_3)(NH_2)_2$, $C_{18}H_{37}Si(CH_3)(NH_2)_2$, $(CH_3)_3SiNH_2$, $C_2H_5Si(CH_3)_2NH_2$, $(C_2H_5)_2Si(CH_3)NH_2$, $(C_2H_5)_3SiNH_2$, $C_3H_7Si(CH_3)_2NH_2$, $(C_3H_7)_2Si(CH_3)NH_2$, $(C_3H_7)_3SiNH_2$, $C_4H_9Si(CH_3)_2NH_2$, $(C_4H_9)_3SiNH_2$, $C_5H_{11}Si(CH_3)_2NH_2$, $C_6H_{13}Si(CH_3)_2NH_2$, $C_7H_{15}Si(CH_3)_2NH_2$, $C_8H_{17}Si(CH_3)_2NH_2$, $C_9H_{19}Si(CH_3)_2NH_2$, $C_{10}H_{21}Si(CH_3)_2NH_2$, $C_{11}H_{23}Si(CH_3)_2NH_2$, $C_{12}H_{25}Si(CH_3)_2NH_2$, $C_{13}H_{27}Si(CH_3)_2NH_2$, $C_{14}H_{29}Si(CH_3)_2NH_2$, $C_{15}H_{31}Si(CH_3)_2NH_2$, $C_{16}H_{33}Si(CH_3)_2NH_2$, $C_{17}H_{35}Si(CH_3)_2NH_2$, $C_{18}H_{37}Si(CH_3)_2NH_2$, $(CH_3)_2Si(H)NH_2$, $CH_3Si(H)_2NH_2$, $(C_2H_5)_2Si(H)NH_2$, $C_2H_5Si(H)_2NH_2$, $C_2H_5Si(CH_3)(H)NH_2$, $(C_3H_7)_2Si(H)NH_2$, $C_3H_7Si(H)_2NH_2$, $CF_3CH_2CH_2Si(NH_2)_3$, $C_2F_5CH_2CH_2Si(NH_2)_3$, $C_3F_7CH_2CH_2Si(NH_2)_3$, $C_4F_9CH_2CH_2Si(NH_2)_3$, $C_5F_{11}CH_2CH_2Si(NH_2)_3$, $C_6F_{13}CH_2CH_2Si(NH_2)_3$, $C_7F_{15}CH_2CH_2Si(NH_2)_3$, $C_8F_{17}CH_2CH_2Si(NH_2)_3$, $CF_3CH_2CH_2Si(CH_3)(NH_2)_2$, $C_2F_5CH_2CH_2Si(CH_3)(NH_2)_2$, $C_3F_7CH_2CH_2Si(CH_3)(NH_2)_2$, $C_4F_9CH_2CH_2Si(CH_3)(NH_2)_2$, $C_5F_{11}CH_2CH_2Si(CH_3)(NH_2)_2$, $C_6F_{13}CH_2CH_2Si(CH_3)(NH_2)_2$, $C_7F_{15}CH_2CH_2Si(CH_3)(NH_2)_2$, $C_8F_{17}CH_2CH_2Si(CH_3)(NH_2)_2$, $CF_3CH_2CH_2Si(CH_3)_2NH_2$, $C_2F_5CH_2CH_2Si(CH_3)_2NH_2$, $C_3F_7CH_2CH_2Si(CH_3)_2NH_2$, $C_4F_9CH_2CH_2Si(CH_3)_2NH_2$, $C_5F_{11}CH_2CH_2Si(CH_3)_2NH_2$, $C_6F_{13}CH_2CH_2Si(CH_3)_2NH_2$, $C_7F_{15}CH_2CH_2Si(CH_3)_2NH_2$, $C_8F_{17}CH_2CH_2Si(CH_3)_2NH_2$, and $CF_3CH_2CH_2Si(CH_3)(H)NH_2$, aminosilane such as aminodimethylvinyl silane, aminodimethylphenylethyl silane, aminodimethylphenyl silane, and aminodimethyl-t-butyl silane, or those obtained by substituting an amino group (—$NH_2$ group) of the aminosilane with —N═C═O, diarylalkylamino group (—N($CH_3$)$_2$, —N($C_2H_5$)$_2$, and the like), t-butylamino group, arylamino group, —N═C═S, —$N_3$, —NHC(═O)$CH_3$, —NHC(═O)$CF_3$, —N($CH_3$)C(═O)$CH_3$, —N($CH_3$)C(═O)$CF_3$, —N═C($CH_3$)OSi($CH_3$)$_3$, —N═C($CF_3$)OSi($CH_3$)$_3$, —NHC(═O)—OSi($CH_3$)$_3$, —NHC(═O)—NH—Si($CH_3$)$_3$ (for example, N,N'-bis(trimethylsilyl)urea and the like), imidazole ring, triazole ring, tetrazole ring, oxazolidinone ring, morpholine ring, —NH—C(═O)—Si($CH_3$)$_3$, —N(H)$_{2-g}$(Si(H)$_h$$R^3$$_{3-h}$)$_g$ ($R^3$ is a monovalent hydrocarbon group having 1 to 18 carbon atoms in which part or all of the hydrogen may be substituted with fluorine, g is 1 or 2, and h is an integer of 0 to 2. For example, tris(dimethylsilyl) amine, tris(trimethylsilyl) amine, and the like), —N(S(═O)$_2$ $R^4$)$_2$ (here, $R^4$ each independently a group selected from the group consisting of a monovalent hydrocarbon group having 1 to 8 carbon atoms in which part or all of hydrogen elements may be substituted with fluorine elements, and a fluorine element. For example, N-(trimethylsilyl)bis(trifluoromethanesulfonyl)imide, and the like), and a substituent having a structure of General Formula [1-2]

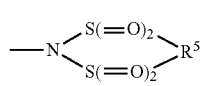

[1-2]

(In General Formula [1-2], $R^5$ each independently is a divalent hydrocarbon group having 1 to 8 carbon atoms in which part or all of hydrogen elements may be substituted with fluorine elements. For example, N-(trimethylsilyl)N,N-difluoromethane-1,3-bis (sulfonyl)imide and the like), —N═C(N$R^6$$_2$)$_2$, —N═C(N$R^6$$_2$)$R^6$ (here, $R^6$ each independently selected from a hydrogen group, a —C≡N group, a —$NO_2$ group, and a hydrocarbon group in which part or all of hydrogen elements may be substituted with fluorine elements, and the hydrocarbon group may have an oxygen atom and/or a nitrogen atom. For example, 2-trimethylsilyl-1,1,3,3-tetramethylguanidine, and the like), —N($R^{a1}$)$R^{a2}$ (here, $R^{a1}$ represents a hydrogen atom or a saturated or unsaturated alkyl group, $R^{a2}$ represents a saturated or unsaturated alkyl group, a saturated or unsaturated cycloalkyl group, or a saturated or unsaturated heterocycloalkyl group. $R^{a1}$ and $R^{a2}$ may be bonded to form a saturated or unsaturated heterocycloalkyl group having a nitrogen atom), —N($R^{a3}$)—Si($R^{a4}$)($R^{a5}$)($R^{a6}$) (here, $R^{a3}$ represents a hydrogen atom, a methyl group, a trimethylsilyl group, or a dimethylsilyl group, and $R^{a4}$, $R^{a5}$, and $R^{a6}$ each independently represent a hydrogen atom or an organic group, and the total number of carbon atoms contained in $R^{a4}$, $R^{a5}$ and $R^{a6}$ is one or more. For example, hexamethyldisilazane, N-methylhexamethyldisilazane, 1,1,3,3-tetramethyldisilazane, 1,3-dimethyldisilazane, 1,2-di-N-octyltetramethyldisilazane, 1,2-divinyltetramethyldisilazane, heptamethyldisilazane, nonamethyltrisilazane, pentamethylethyldisilazane, pentamethylvinyldisilazane, pentamethylpropyldisilazane, pentamethylethyldisilazane, pentamethyl-t-butyldisilazane, pentamethylphenyldisilazane, trimethyltriethyldisilazane, and the like), —N($R^{a7}$)—C(═O)$R^{a8}$ (here, $R^{a7}$ represents a hydrogen atom, a methyl group, a trimethylsilyl group, or a dimethylsilyl group, and $R^{a8}$ represents a hydrogen atom, a saturated or unsaturated alkyl group, a fluorine-containing alkyl group, or a trialkylsilylamino group. For example, N-trimethylsilylacetamide, N-trimethylsilyltrifluoroacetamide, N-methyl-N-trimethylsilylacetamide, N-methyl-N-trimethylsilyltrifluoroacetamide, bis(trimethylsilyl)acetamide, bis(trimethylsilyl)trifluoroacetamide, and the like).

Examples of the silylating agent in which X in General Formula [1] is a monovalent organic group in which the element bonded to the Si element is oxygen include those obtained by substituting an amino group (—$NH_2$ group) of the aminosilane with —O—C(═A)$R^{a9}$ (here, A represents O, CH$R^{a10}$, CHO$R^{a10}$, C$R^{a10}$$R^{a10}$, or N$R^{a11}$, $R^{a9}$ and $R^{a10}$ each independently are a hydrogen atom, a saturated or unsaturated alkyl group, a saturated or unsaturated cycloalkyl group, a fluorinated alkyl group, a trialkylsilyl group, a trialkylsiloxy group, an alkoxy group, a phenyl group, a phenylethyl group, or an acetyl group, and $R^{a11}$ represents a hydrogen atom, an alkyl group, or a trialkylsilyl group. For example, trimethylsilyl acetate, dimethylsilyl acetate, monomethylsilyl acetate, trimethylsilyl trifluoroacetate, dimethylsilyl trifluoroacetate, monomethylsilyl trifluoroacetate, trimethylsilyl propionate, trimethylsilyl butyrate, and the like), —O—C($R^{a12}$)═N($R^{a13}$) (here, $R^{a12}$ represents a hydrogen atom, a saturated or unsaturated alkyl group, a fluorine-containing alkyl group, or a trialkylsilylamino group, and $R^{a13}$ represents a hydrogen atom, an alkyl group, and a trialkylsilyl group), —O—C($R^{a14}$)═CH—C(═O)$R^{a15}$ (here, $R^{a14}$ and $R^{a15}$ each independent represents a hydrogen atom or an organic group. For example, trimethylsilyloxy-3-pentene-2-one, 2-trimethylsiloxypenta-2-en-4-one, and the like), —O$R^{a16}$ (here, $R^{a16}$ represents a saturated or unsaturated alkyl group, a saturated or unsaturated cycloalkyl group, or a fluorine-containing alkyl group. For example, alkylmethoxy silane such as $CH_3Si(OCH_3)_3$, $C_2H_5Si(OCH_3)_3$, $C_3H_7Si(OCH_3)_3$, $C_4H_9Si(OCH_3)_3$, $C_5H_{11}Si(OCH_3)_3$, $C_6H_{13}Si(OCH_3)_3$, $C_7H_{15}Si(OCH_3)_3$, $C_8H_{17}Si(OCH_3)_3$, $C_9H_{19}Si(OCH_3)_3$, $C_{10}H_{21}Si(OCH_3)_3$, $C_{11}H_{23}Si(OCH_3)_3$, $C_{12}H_{25}Si(OCH_3)_3$, $C_{13}H_{27}Si(OCH_3)_3$, $C_{14}H_{29}Si(OCH_3)_3$, $C_{15}H_{31}Si(OCH_3)_3$, $C_{16}H_{33}Si(OCH_3)_3$, $C_{17}H_{35}Si(OCH_3)_3$, $C_{18}H_{37}Si(OCH_3)_3$, $(CH_3)_2Si(OCH_3)_2$, $C_2H_5Si(CH_3)(OCH_3)_2$, $(C_2H_5)_2Si(OCH_3)_2$, $C_3H_7Si(CH_3)(OCH_3)_2$, $(C_3H_7)_2Si(OCH_3)_2$, $C_4H_9Si(CH_3)(OCH_3)_2$, $(C_4H_9)_2Si(OCH_3)_2$, $C_5H_{11}Si(CH_3)(OCH_3)_2$, $C_6H_{13}Si(CH_3)(OCH_3)_2$, $C_7H_{15}Si(CH_3)(OCH_3)_2$, $C_8H_{17}Si(CH_3)(OCH_3)_2$, $C_9H_{19}Si(CH_3)(OCH_3)_2$, $C_{10}H_{21}Si(CH_3)(OCH_3)_2$, $C_{11}H_{23}Si(CH_3)(OCH_3)_2$, $C_{12}H_{25}Si(CH_3)(OCH_3)_2$, $C_{13}H_{27}Si(CH_3)(OCH_3)_2$, $C_{14}H_{29}Si(CH_3)(OCH_3)_2$, $C_{15}H_{31}Si(CH_3)(OCH_3)_2$, $C_{16}H_{33}Si(CH_3)(OCH_3)_2$, $C_{17}H_{35}Si(CH_3)(OCH_3)_2$, $C_{18}H_{37}Si(CH_3)(OCH_3)_2$, $(CH_3)_3SiOCH_3$, $C_2H_5Si(CH_3)_2OCH_3$, $(C_2H_5)_2Si(CH_3)OCH_3$, $(C_2H_5)_3SiOCH_3$, $C_3H_7Si(CH_3)_2OCH_3$, $(C_3H_7)_2Si(CH_3)OCH_3$, $(C_3H_7)_3SiOCH_3$, $C_4H_9Si(CH_3)_2OCH_3$, $(C_4H_9)_3SiOCH_3$, $C_5H_{11}Si(CH_3)_2OCH_3$, $C_6H_{13}Si(CH_3)_2OCH_3$, $C_7H_{15}Si(CH_3)_2OCH_3$, $C_8H_{17}Si(CH_3)_2OCH_3$, $C_9H_{19}Si(CH_3)_2OCH_3$, $C_{10}H_{21}Si(CH_3)_2OCH_3$, $C_{11}H_{23}Si(CH_3)_2OCH_3$, $C_{12}H_{25}Si(CH_3)_2OCH_3$, $C_{13}H_{27}Si(CH_3)_2OCH_3$, $C_{14}H_{29}Si(CH_3)_2OCH_3$, $C_{15}H_{31}Si(CH_3)_2OCH_3$, $C_{16}H_{33}Si(CH_3)_2OCH_3$, $C_{17}H_{35}Si(CH_3)_2OCH_3$, $C_{18}H_{37}Si(CH_3)_2OCH_3$, $(CH_3)_2Si(H)OCH_3$, $CH_3Si(H)_2OCH_3$, $(C_2H_5)_2Si(H)OCH_3$, $C_2H_5Si(H)_2OCH_3$, $C_2H_5Si(CH_3)(H)OCH_3$, and $(C_3H_7)_2Si(H)OCH_3$, or fluoroalkylmethoxy silane such as $CF_3CH_2CH_2Si(OCH_3)_3$, $C_2F_5CH_2CH_2Si(OCH_3)_3$, $C_3F_7CH_2CH_2Si(OCH_3)_3$, $C_4F_9CH_2CH_2Si(OCH_3)_3$, $C_5F_{11}CH_2CH_2Si(OCH_3)_3$, $C_6F_{13}CH_2CH_2Si(OCH_3)_3$, $C_7F_{15}CH_2CH_2Si(OCH_3)_3$, $C_8F_{17}CH_2CH_2Si(OCH_3)_3$, $CF_3CH_2CH_2Si(CH_3)(OCH_3)_2$, $C_2F_5CH_2CH_2Si(CH_3)(OCH_3)_2$, $C_3F_7CH_2CH_2Si(CH_3)(OCH_3)_2$, $C_4F_9CH_2CH_2Si(CH_3)(OCH_3)_2$, $C_5F_{11}CH_2CH_2Si(CH_3)(OCH_3)_2$, $C_6F_{13}CH_2CH_2Si(CH_3)(OCH_3)_2$, $C_7F_{15}CH_2CH_2Si(CH_3)(OCH_3)_2$, $C_8F_{17}CH_2CH_2Si(CH_3)$ (OCH$_3$)$_2$, CF$_3$CH$_2$CH$_2$Si(CH$_3$)$_2$OCH$_3$, C$_2$F$_5$CH$_2$CH$_2$Si (CH$_3$)$_2$OCH$_3$, C$_3$F$_7$CH$_2$CH$_2$Si(CH$_3$)$_2$OCH$_3$, C$_4$F$_9$CH$_2$CH$_2$Si(CH$_3$)$_2$OCH$_3$, C$_5$F$_{11}$CH$_2$CH$_2$Si(CH$_3$)$_2$ OCH$_3$, C$_6$F$_{13}$CH$_2$CH$_2$Si(CH$_3$)$_2$OCH$_3$, C$_7$F$_{15}$CH$_2$CH$_2$Si (CH$_3$)$_2$OCH$_3$, C$_8$F$_{17}$CH$_2$CH$_2$Si(CH$_3$)$_2$OCH$_3$, and CF$_3$CH$_2$CH$_2$Si(CH$_3$)(H)OCH$_3$, or those obtained by substituting a methyl group moiety of the methoxy silane with a monovalent hydrocarbon group having 2 to 18 carbon atoms in which part or all of the hydrogen elements may be substituted with a fluorine element.

Examples of the silylating agent in which X in General Formula [1] is a monovalent organic group in which the element bonded to the Si element is carbon include those obtained by substituting an amino group (—NH$_2$ group) of the aminosilane with —C(S(=O)$_2$R$^7$)$_3$ (here, R$^7$ each independently is a group selected from the group consisting of a monovalent hydrocarbon group having 1 to 8 carbon atoms in which part or all of hydrogen elements may be substituted with fluorine elements, and a fluorine element. For example, (trimethylsilyl)tris(trifluoromethanesulfonyl)methide, and the like).

In addition, examples of the silylating agent in which X in General Formula [1] is a monovalent organic group in which the element bonded to the Si element is a halogen include those obtained by substituting an amino group (—NH$_2$ group) of the aminosilane with a chloro group or a bromo group, and an iodo group (for example, chlorotrimethylsilane, bromotrimethylsilane, and the like).

The cyclic silazane compound can be included as the silylating agent.

Examples of the cyclic silazane compound include a cyclic disilazane compound such as 2,2,5,5-tetramethyl-2,5-disila-1-azacyclopentane and 2,2,6,6-tetramethyl-2,6-disila-1-azacyclohexane; cyclic trisilazane compound such as 2,2,4,4,6,6-hexamethylcyclotrisilazane and 2,4,6-trimethyl-2,4,6-trivinylcyclotrisilazane; cyclic tetrasilazane compound such as 2,2,4,4,6,6,8,8-octamethylcyclotetrasilazane; and the like.

In addition to the silylating agent, the bevel portion treatment agent composition can contain one or more selected from the group consisting of a compound A to be described later, an acid imidized product, a nitrogen-containing compound, a nitrogen-containing heterocyclic compound, and a silylated heterocyclic compound, as an accelerator (catalyst) of the silylating agent.

The concentration of the accelerator may be, for example, 0.01% by mass to 50% by mass, or may be 0.05% by mass to 25% by mass with respect to 100% by mass of the entire silylating agent.

The bevel portion treatment agent composition can further contain the compound A as an accelerator.

Specific examples of the compound A include trimethylsilyl trifluoroacetate, trimethylsilyl trifluoromethanesulfonate, dimethylsilyl trifluoroacetate, dimethylsilyl trifluoromethanesulfonate, butyldimethylsilyl trifluoroacetate, butyldimethylsilyl trifluoromethanesulfonate, hexyldimethylsilyl trifluoroacetate, hexyldimethylsilyl trifluoromethanesulfonate, octyldimethylsilyl trifluoroacetate, octyldimethylsilyl trifluoromethanesulfonate, decyldimethylsilyl trifluoroacetate, and decyldimethylsilyl trifluoromethanesulfonate, and can include one or more selected therefrom. These may be used alone or in combination of two or more.

Although the compound A may correspond to the silylating agent, in a case of being used as an accelerator, it means that the compound A is used in combination with other silylating agents other than the compound A.

The compound A as the accelerator may be those obtained by reacting a silicon compound represented by General Formula [2], and one or more acetic acid or sulfonic acid selected from the group consisting of trifluoroacetic acid, trifluoroacetic acid anhydride, trifluoromethanesulfonic acid, and trifluoromethanesulfonic acid anhydride.

The surplus silicon compound represented by General Formula [2] that remains without being consumed in this reaction can be used together with the compound A obtained in the reaction as the silylating agent. The silicon compound represented by General Formula [2] is, for example, 0.2 to 100,000 mol times, preferably 0.5 to 50,000 mol times, more preferably 1 to 10,000 mol times in terms of molar ratio with respect to the acetic acid or sulfonic acid.

$$R^2{}_c(H)_dSi—X \qquad [2]$$

In General Formula [2], examples of $R^2{}_c(H)_dSi$— include (CH$_3$)$_3$Si—, (CH$_3$)$_2$(H)Si—, (C$_4$H$_9$)(CH$_3$)$_2$Si—, (C$_6$H$_{13}$) (CH$_3$)$_2$Si—, (C$_8$H$_{17}$)(CH$_3$)$_2$Si—, (C$_{10}$H$_{21}$)(CH$_3$)$_2$Si, and the like. In addition, X is the same as General Formula [1].

In addition, the compound A as the accelerator may be at least one selected from the group consisting of a sulfonic acid represented by General Formula [3], an anhydride of the sulfonic acid, a salt of the sulfonic acid, and a sulfonic acid derivative represented by General Formula [4].

$$R^8—S(=O)_2OH \qquad [3]$$

[In General Formula [3], R$^8$ is a group selected from the group consisting of a monovalent hydrocarbon group having 1 to 8 carbon atoms in which part or all of hydrogen elements may be substituted with fluorine elements, and a hydroxyl group.]

$$R^8—S(=O)_2O—Si(H)_{3-r}(R^9)_r \qquad [4]$$

[In General Formula [4], R$^8$ is a monovalent hydrocarbon group having 1 to 8 carbon atoms in which part or all of hydrogen elements may be substituted with fluorine elements, R$^9$ each independently is at least one group selected from monovalent hydrocarbon groups having 1 to 18 carbon atoms in which part or all of hydrogen elements may be substituted with fluorine elements, and r is an integer of 1 to 3.]

In addition, the compound A as the accelerator may be at least one selected from the group consisting of a sulfonic acid ester represented by General Formula [5], a sulfonimide represented by General Formulas [6] and [7], a sulfonimide derivative represented by General Formulas [8] and [9], sulfonmethide represented by General Formula [10], and a sulfonmethide derivative represented by General Formula [11].

$$R^{10}—S(=O)_2OR^{11} \qquad [5]$$

[In General Formula [5], R$^{10}$ is a group selected from the group consisting of a monovalent hydrocarbon group having 1 to 8 carbon atoms in which part or all of hydrogen elements may be substituted with fluorine elements, and a fluorine element, and R$^{11}$ is a monovalent alkyl group having 1 to 18 carbon atoms.]

$$(R^{12}—S(=O)_2)_2NH \qquad [6]$$

[In General Formula [6], R$^{12}$ each independently is a group selected from a monovalent hydrocarbon group having 1 to 8 carbon atoms in which part or all of hydrogen elements may be substituted with fluorine elements, and a fluorine element.]

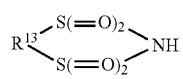
[7]

[In General Formula [7], $R^{13}$ is a divalent hydrocarbon group having 1 to 8 carbon atoms in which part or all of hydrogen elements may be substituted with fluorine elements.]

$((R^{14}-S(=O)_2)_2N)_s Si(H)_t(R^{15})_{4-s-t}$ [8]

[In General Formula [8], $R^{14}$ each independently is a group selected from the group consisting of a monovalent hydrocarbon group having 1 to 8 carbon atoms in which part or all of hydrogen elements may be substituted with fluorine elements, $R^{15}$ each independently a monovalent hydrocarbon group having 1 to 18 carbon atoms in which part or all of hydrogen elements may be substituted with fluorine elements, s is an integer of 1 to 3, t is an integer of 0 to 2, and the sum of s and t is equal to or less than 3.]

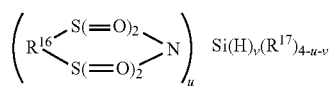
[9]

[In General Formula [9], $R^{16}$ each independently is a divalent hydrocarbon group having 1 to 8 carbon atoms in which part or all of the hydrogen elements may be substituted with fluorine elements, $R^{17}$ each independently is a monovalent hydrocarbon group having 1 to 18 carbon atoms in which part or all of the hydrogen elements may be substituted with fluorine elements, u is an integer of 1 to 3, v is an integer of 0 to 2, and the sum of u and v is equal to or less than 3.]

$(R^{18}-S(=O)_2)_3 CH$ [10]

[In General Formula [10], $R^{18}$ each independently is a group selected from the group consisting of a monovalent hydrocarbon group having 1 to 8 carbon atoms in which part or all of hydrogen elements may be substituted with fluorine elements, and a fluorine element.]

$((R^{19}-S(=O)_2)_3C)_w Si(H)_x(R^{20})_{4-w-x}$ [11]

[In General Formula [11], $R^{19}$ each independently is a group selected from the group consisting of a monovalent hydrocarbon group having 1 to 8 carbon atoms in which part or all of hydrogen elements may be substituted with fluorine elements, and a fluorine element, $R^{20}$ each independently is a monovalent group having 1 to 18 carbon atoms in which part or all of hydrogen elements may be substituted with fluorine elements, w is an integer of 1 to 3, x is an integer of 0 to 2, and the sum of w and x is equal to or less than 3.]

The bevel portion treatment agent composition can further contain an acid imide compound such as a carboxylic acid imidized product or a phosphoric acid imidized product, if necessary.

Examples of the acid imidized product include compounds having a chemical structure in which an acid such as carboxylic acid and phosphoric acid is imidized.

The bevel portion treatment agent composition can further contain at least one nitrogen-containing compound among the compounds represented by General Formulas [12] and [13], if necessary.

$R^{21}-N=C(NR^{22}_2)_2$ [12]

$R^{21}-N=C(NR^{22}_2)R^{22}$ [13]

In General formulas [12] and [13], $R^{21}$ is selected from a hydrogen group, a —C≡N group, a —NO_2 group, an alkylsilyl group, and a hydrocarbon group in which part or all of hydrogen elements may be substituted with fluorine elements, the hydrocarbon group may have an oxygen atom and/or a nitrogen atom, and in a case of including a nitrogen atom, $R^{21}$ has an acyclic structure. $R^{22}$ each independently is selected from a hydrogen group, a —C≡N group, a —NO_2 group, and a hydrocarbon group in which part or all of hydrogen elements may be substituted with fluorine elements, the hydrocarbon group may have an oxygen atom and/or a nitrogen atom, and in a case of including a nitrogen atom, $R^{22}$ has an acyclic structure.]

Examples of the nitrogen-containing compound include guanidine, 1,1,3,3-tetramethylguanidine, 2-tert-butyl-1,1,3,3-tetramethylguanidine, 1,3-diphenylguanidine, 1,2,3-triphenylguanidine, N,N'-diphenylformamidine, 2,2,3,3,3-pentafluoropropylamidine, and the like.

The bevel portion treatment agent composition can further contain at least one nitrogen-containing compound among the compounds represented by General Formulas [14] and [15], if necessary.

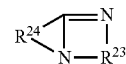
[14]

[In General Formula [14], $R^{23}$ and $R^{24}$ each independently are a divalent organic group consisting of a carbon element and/or a nitrogen element and a hydrogen element, and the total number of carbon atoms and nitrogen number is 1 to 9, and in the case of two or more, carbon elements that do not form a ring may be present.]

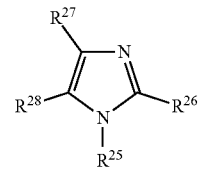
[15]

[In General Formula [15], $R^{25}$ each independently an alkyl group having 1 to 6 carbon atoms in which part or all of hydrogen elements may be substituted with fluorine elements, a trialkylsilyl group having an alkyl group having 1 to 8 carbon atoms in which part or all of hydrogen elements may be substituted with fluorine elements, an alkenyl group having 2 to 6 carbon atoms in which part or all of the hydrogen elements may be substituted with fluorine elements, an alkoxy group having 1 to 6 carbon atoms in which part or all of hydrogen elements may be substituted with fluorine elements, an amino group, an alkylamino group having an alkyl group having 1 to 6 carbon atoms in which part or all of hydrogen elements may be substituted with fluorine elements, a dialkylamino group having an alkyl group having 1 to 6 carbon atoms in which part or all of hydrogen elements may be substituted with fluorine elements, an aminoalkyl group having 1 to 6 carbon atoms in which part or all of hydrogen elements may be substituted with fluorine elements, a nitro group, a cyano group, a phenyl group, a benzyl group, or a halogen group, and $R^{26}$, $R^{27}$, and $R^{28}$ each independently are an alkyl group having 1 to 6 carbon atoms in which part or all of hydrogen elements may be substituted with fluorine elements, or a hydrogen group.]

The bevel portion treatment agent composition can further contain a nitrogen-containing heterocyclic compound not containing a silicon atom, if necessary.

The nitrogen-containing heterocyclic compound may contain a hetero atom other than a nitrogen atom such as an oxygen atom or a sulfur atom in the ring, may have an aromaticity, and may be a compound in which two or more rings are bonded by a single bond or a polyvalent linking group having a valence of 2 or more.

Examples of the nitrogen-containing heterocyclic compound include pyridine, pyridazine, pyrazine, pyrimidine, triazine, tetrazine, pyrrol, pyrazole, imidazole, methylimidazole, triazole, tetrazole, oxazole, isooxazole, triazole, isothiazole, oxadiazole, thiadiazole, quinoline, isoquinoline, synnoline, phthalazine, quinoxaline, quinazoline, indole, indazole, benzimidazole, benzotriazole, benzoxazole, benzoisoxazole, benzothiazole, benzoisothiazole, benzoxadiazole, benzothiadiazole, saccharin, pyrrolidine, piperidine, and the like.

The nitrogen-containing heterocyclic compound may have a substituent(s).

The bevel portion treatment agent composition may further contain a silylated heterocyclic compound, if necessary.

Examples of the silylated heterocyclic compound include a silylated imidazole compound and a silylated triazole compound. Examples of the silylated heterocyclic compound include monomethylsilylimidazole, dimethylsilylimidazole, trimethylsilylimidazole, monomethylsilyltriazole, dimethylsilyltriazole, trimethylsilyltriazole, and the like.

Although the silylated heterocyclic compound corresponds to the silylating agent, in a case of being used as an accelerator, it means that the silylated heterocyclic compound is used in combination with other silylating agents other than the silylated heterocyclic compound.

The bevel portion treatment agent composition may contain a solvent.

The solvent is not particularly limited as long as it dissolves the silylating agent. Examples of the solvent include organic solvents such as hydrocarbons, esters, ethers, ketones, halogen element-containing solvents, sulfoxide-based solvents, alcohols, carbonate-based solvents, polyhydric alcohol derivatives, nitrogen element-containing solvents, silicone solvents, and thiols. Among these, those that do not have an OH group among hydrocarbons, esters, ethers, halogen element-containing solvents, sulfoxide-based solvents, and polyhydric alcohol derivatives are preferable.

These may be used alone or in combination of two or more.

Examples of the hydrocarbons include n-hexane, n-heptane, n-octane, n-nonane, n-decane, n-undecane, n-dodecane, n-tetradecane, n-hexadecane, n-octadecane, n-icosan, and branched hydrocarbons corresponding to carbon atoms of these (for example, isododecane, isocetane, and the like), cyclohexane, methylcyclohexane, decalin, benzene, toluene, xylene, (ortho-, meta-, or para-) diethylbenzene, 1,3,5-trimethylbenzene, naphthalene, and the like.

In addition, as the hydrocarbons, from a viewpoint of storage stability of the silylating agent, hydrocarbon-based non-polar solvents such as linear, branched, or cyclic hydrocarbon-based solvents, aromatic hydrocarbon-based solvents, and terpene-based solvents may be used. Among these, a linear or branched hydrocarbon-based solvent having 6 to 12 carbon atoms or a terpene-based solvent is preferable. Examples of terpene-based solvents include p-menthane, diphenylmenthane, limonene, terpinene, bornane, norbornane, pinane, and the like.

Examples of the esters include ethyl acetate, n-propyl acetate, i-propyl acetate, n-butyl acetate, i-butyl acetate, n-pentyl acetate, i-pentyl acetate, n-hexyl acetate, n-heptyl acetate, n-octyl acetate, n-pentyl formate, n-butyl propionate, ethyl butyrate, n-propyl butyrate, i-propyl butyrate, n-butyl butyrate, methyl n-octanoate, methyl decanoate, methyl pyruvate, ethyl pyruvate, n-propyl pyruvate, methyl acetoacetate, ethyl acetoacetate, ethyl 2-oxobutanoate, dimethyl adipate, methyl 3-methoxypropionate, ethyl 3-methoxypropionate, methyl 3-ethoxypropionate, 3-ethyl ethoxypropionate, ethyl ethoxyacetate, and the like.

In addition, as the esters, cyclic esters such as a lactone compound may be used. Examples of lactone compounds include β-propiolactone, γ-butyrolactone, γ-valerolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone, ε-hexanolactone, and the like.

Examples of the ethers include di-n-propyl ether, ethyl-n-butyl ether, di-n-butyl ether, ethyl-n-amyl ether, di-n-amyl ether, ethyl-n-hexyl ether, di-n-hexyl ether, di-n-octyl ether, and ethers having a branched hydrocarbon group corresponding to carbon atoms of these such as diisopropyl ether and diisoamylether, dimethyl ether, diethyl ether, methyl ethyl ether, methyl cyclopentyl ether, diphenyl ether, tetrahydrofuran, dioxane, and the like.

Examples of the ketones include acetone, acetylacetone, methyl ethyl ketone, methyl propyl ketone, methyl butyl ketone, 2-heptanone, 3-heptanone, cyclohexanenone, isophorone, and the like.

Examples of the halogen element-containing solvent include perfluorocarbons such as perfluorooctane, perfluorononane, perfluorocyclopentane, perfluorocyclohexane, and hexafluorobenzene, hydrofluorocarbons such as 1,1,1,3,3-pentafluorobutane, octafluocycyclopentane, 2,3-dihydrodecafluoropentane, Zeolola H (manufactured by Nippon Zeon), hydrofluoroethers such as methylperfluoropropyl ether, methylperfluoroisobutyl ether, methylperfluorobutyl ether, ethylperfluorobutyl ether, ethylperfluoroisobutyl ether, methylperfluorohexyl ether, ethylperfluorohexyl ether, Asahiclean AE-3000 (manufactured by Asahi Glass), Novec HFE-7100, Novec HFE-7200, Novec7300, Novec7600 (all manufactured by 3M), chlorocarbons such as tetrachloromethane, hydrochlorocarbons such as chloroform, chlorofluorocarbons such as dichlorodifluoromethane, hydrochlorofluorocarbons such as 1,1-dichloro-2,2,3,3,3-pentafluoropropane, 1,3-dichloro-1,1,2,2,3-pentafluoropropane, 1-chloro-3,3,3-trifluoropropene, and 1,2-dichloro-3,3,3-trifluoropropene, perfluoroether, perfluoropolyether, and the like.

Examples of the sulfoxide-based solvent include dimethyl sulfoxide and the like.

Examples of the carbonate-based solvent include dimethyl carbonate, ethyl methyl carbonate, diethyl carbonate, propylene carbonate, and the like.

Examples of the polyhydric alcohol derivatives not having an OH group include ethylene glycol dimethyl ether, ethylene glycol diethyl ether, ethylene glycol dibutyl ether, ethylene glycol monomethyl ether acetate, ethylene glycol monoethyl ether acetate, ethylene glycol monobutyl ether acetate, ethylene glycol diacetate, diethylene glycol dimethyl ether, diethylene glycol ethyl methyl ether, diethylene glycol diethyl ether, diethylene glycol butyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol dimethyl ether, propylene glycol diethyl Ether, propylene glycol dibutyl ether, propylene glycol monomethyl ether acetate, propylene glycol monoethyl ether acetate, propylene glycol monobutyl ether acetate, propylene glycol diacetate, dipropylene glycol dimethyl ether, dipropylene glycol methyl propyl ether, dipropylene glycol diethyl ether, dipropylene glycol dibutyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol dimethyl ether, butylene glycol monomethyl ether acetate, butylene glycol diacetate, glycerin triacetate, 3-methoxybutyl acetate, 3-methyl-3-methoxybutyl acetate, 3-methyl-3-methoxybutyl propionate, and the like.

Examples of the nitrogen element-containing solvent include formamide, N,N-dimethylformamide, N,N-dimethylacetamide, N-methyl-2-pyrrolidone, N-ethyl-2-pyrrolidone, N-propyl-2-pyrrolidone, 1,3-dimethyl-2-imidazolidinone, 1,3-diethyl-2-imidazolidinone, 1,3-diisopropyl-2-imidazolidinone, diethylamine, triethylamine, pyridine, and the like.

Examples of the silicone solvent include hexamethyldisiloxane, octamethyltrisiloxane, decamethyltetrasiloxane, dodecamethylpentasiloxane, and the like.

Examples of the thiols include 1-hexanethiol, 2-methyl-1-pentanethiol, 3-methyl-1-pentanethiol, 4-methyl-1-pentanethiol, 2,2-dimethyl-1-butanethiol, 3,3-dimethyl-1-butanethiol, 2-ethyl-1-butanethiol, 1-heptanethiol, benzylthiol, 1-octanethiol, 2-ethyl-1-hexanethiol, 1-nonanthiol, 1-decanethiol, 1-undecanethiol, 1-dodecanethiol, 1-tridecanethiol, and the like.

From a viewpoint of cost and solubility, diethylene glycol monoethyl ether acetate, ethylene glycol monomethyl ether acetate, propylene glycol monomethyl ether acetate, diethylene glycol dimethyl ether, diethylene glycol ethyl methyl ether, diethylene glycol diethyl ether, diethylene glycol monomethyl ether acetate, diethylene glycol diacetate, triethylene glycol dimethyl ether, ethylene glycol diacetate, and ethylene glycol dimethyl ether are preferable.

The bevel portion treatment agent composition may be a silylating agent diluted with a solvent.

In the bevel portion treatment agent composition, the concentration of the silylating agent or the total concentration of the silylating agent and the accelerator may be 0.01% by mass to 100% by mass, preferably 0.1% by mass to 50% by mass, and more preferably 1% by mass to 30% by mass, for example, with respect to 100% by mass of the solvent.

The bevel portion treatment agent composition may contain components other than the components as long as the object of the present invention is not impaired. Examples of other components include oxidizing agents such as hydrogen peroxide and ozone, surfactants, and the like.

The bevel portion treatment agent composition of the present embodiment is obtained by mixing each of the components. The obtained mixed solution may be purified by using an adsorbent, a filter, or the like, if necessary.

The present invention is not limited to the embodiments, and modifications, improvements, and the like within the range in which the object of the present invention can be achieved are included in the present invention.

Although the embodiments of the present invention have been described above, these are examples of the present invention, and various configurations other than the above can be adopted.

EXAMPLES

Preparation of Treatment Agent Composition

Experimental Example 1

10 g of $(H_3C)_3Si-N(CH_3)_2$ and 1 g of $CF_3C(=O)OH$ were mixed with 989 g of propylene glycol monomethyl ether acetate (PGMEA) at a liquid temperature of 25° C. for 1 minute, $(H_3C)_3Si-N(CH_3)_2$ was reacted with $CF_3C(=O)OH$ to prepare a treatment agent composition including $CF_3C(=O)OSi(H_3C)_3$ as compound A and $(H_3C)_3Si-N(CH_3)_2$ as silicon compound. The treatment agent composition A within 30 minutes after preparation was used. Hereinafter, "within 30 minutes after preparation" will be referred to as "immediately after preparation".

Experimental Example 2

Hexamethyldisilazane (HMDS) was mixed with PGMEA at a liquid temperature of 25° C. for 1 minute to prepare a mixed solution having an HMDS concentration of 5% by mass. The mixed solution immediately after preparation was used as a bevel portion treatment agent composition B.

Experimental Example 3

HMDS was mixed with PGMEA at a liquid temperature of 25° C. for 1 minute to prepare a mixed solution having an HMDS concentration of 3% by mass. The mixed solution immediately after preparation was used as a bevel portion treatment agent composition C.

Experimental Example 4

The bevel portion treatment agent composition containing $CF_3C(=O)OSI(H_3C)_3$ as compound A and $(H_3C)_3Si-N(CH_3)_2$ as silicon compound was prepared in the same manner as in Experimental Example 1. The obtained treatment agent composition A stored in an HDPE container at 25° C. for 2 weeks was used as a treatment agent composition D.

Measurement of Surface Modification Index

In the treatment agent compositions A to D obtained in Experimental Examples 1 to 4, based on the following procedures (1) to (4), a "surface modification index Y" representing the critical surface tension of the silicon oxide film, and a "surface modification index Z" representing the critical surface tension of the silicon nitride film were measured. The measurement results are shown in Table 1.

Procedure (1) A substrate having a silicon oxide film ($SiO_2$ film, thermal oxide film) having a thickness of 1 μm on the surface was treated with the obtained treatment agent composition. The treatment conditions were as follows: the substrate was immersed in a 1% by mass hydrofluoric acid aqueous solution at room temperature for 10 minutes, subsequently, immersed in pure water for 1 minute, and in 2-propanol (iPA) for 1 minute, subsequently, immersed in the obtained treatment agent composition at 25° C. for 1 minute, subsequently, immersed in iPA for 1 minute, finally the substrate was removed from the iPA, and air was blown to remove the iPA on the surface of the substrate.

(2) The critical surface tension of the silicon oxide film after treatment (1) was obtained by the Zisman plot method using two or more kinds of measuring liquids having different mixing ratios of water and iPA (mixing ratios of water and iPA are 100:0, 99:1, 95:5, 87:13, 80:20, 66:34, 60:40, 50:50, 40:60, 30:70, 20:80, 10:90, 5:95, 3:97, and 0:100, in terms of mass ratio. The obtained value (mN/m) of the critical surface tension of the silicon oxide film was used as the "surface modification index Y".

(3) A substrate having a silicon nitride film (SiN film, LP-CVD film) having a thickness of 50 nm on the surface was treated with the obtained treatment agent composition. The treatment conditions were as follows: the substrate was immersed in a 1% by mass hydrofluoric acid aqueous solution at room temperature for 10 minutes, subsequently, immersed in pure water for 1 minute, and in iPA for 1 minute, subsequently, immersed in the obtained treatment agent composition at 25° C. for 1 minute, subsequently, immersed in iPA for 1 minute, finally, the substrate was removed from the iPA, and air was blown to remove the iPA on the surface of the substrate.

(4) The critical surface tension of the silicon nitride film after treatment (3) was obtained by the Zisman plot method using two or more kinds of measuring liquids having different mixing ratios of water and iPA (mixing ratios of water and iPA are 100:0, 99:1, 95:5, 87:13, 80:20, 66:34, 60:40, 50:50, 40:60, 30:70, 20:80, 10:90, 5:95, 3:97, and 0:100 in terms of mass ratio). The obtained value (mN/m) of the critical surface tension of the silicon nitride film was defined as the "surface modification index Z".

The mixing ratio of water and iPA in the measuring liquids used in each of Experimental Examples 1 to 4 was as follows.

Experimental Example 1

Surface modification index Y (80:20, 66:34, 60:40, 50:50, 40:60, 30:70, 20:80, 10:90, 5:95)
Surface modification index Z (80:20, 66:34, 60:40, 50:50)

Experimental Example 2

Surface modification index Y (80:20, 66:34, 60:40)
Surface modification index Z (87:13, 80:20)

Experimental Example 3

Surface modification index Y (99:1, 95:5)
Surface modification index Z (87:13, 80:20)

Experimental Example 4

Surface modification index Y (100:0, 99:1, 95:5, 87:13, 80:20, 66:34, 60:40, 50:50, 40:60, 30:70, 20:80 10:90, 5:95, 3:97, 0:100)
Surface modification index Z (87:13, 80:20)

Figure 2:
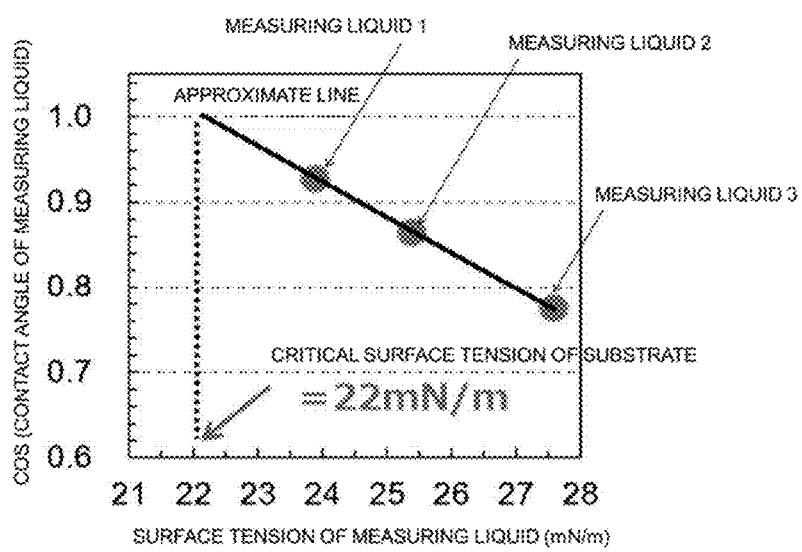
FIG. 2 is a diagram for explaining an outline of a Zisman plot method.
Figure 3:
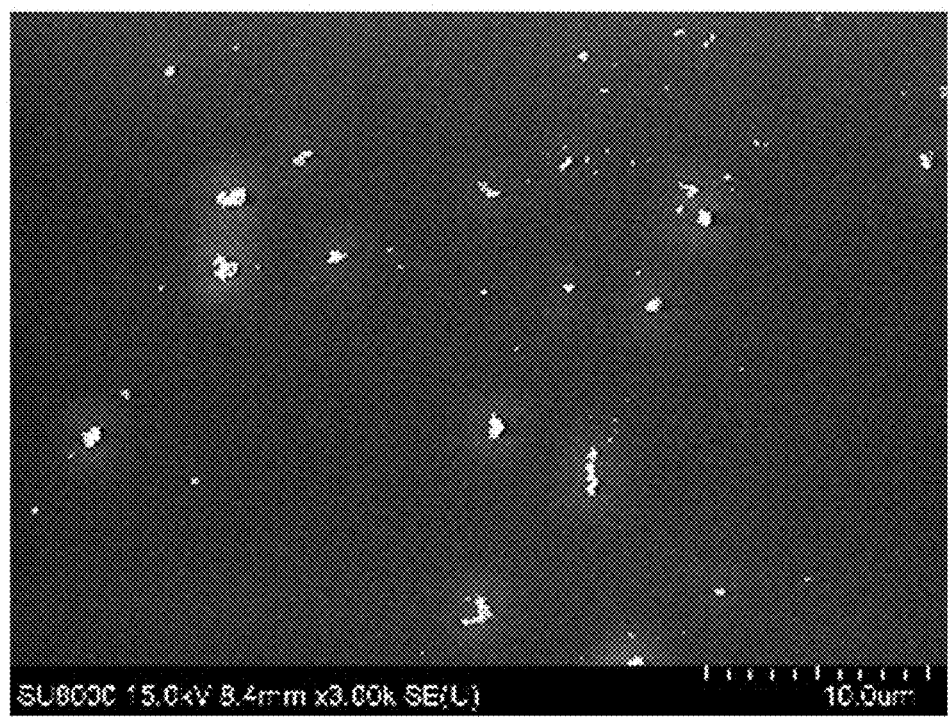
FIG. 3 is a diagram showing an SEM image of Example 1.
Figure 4:
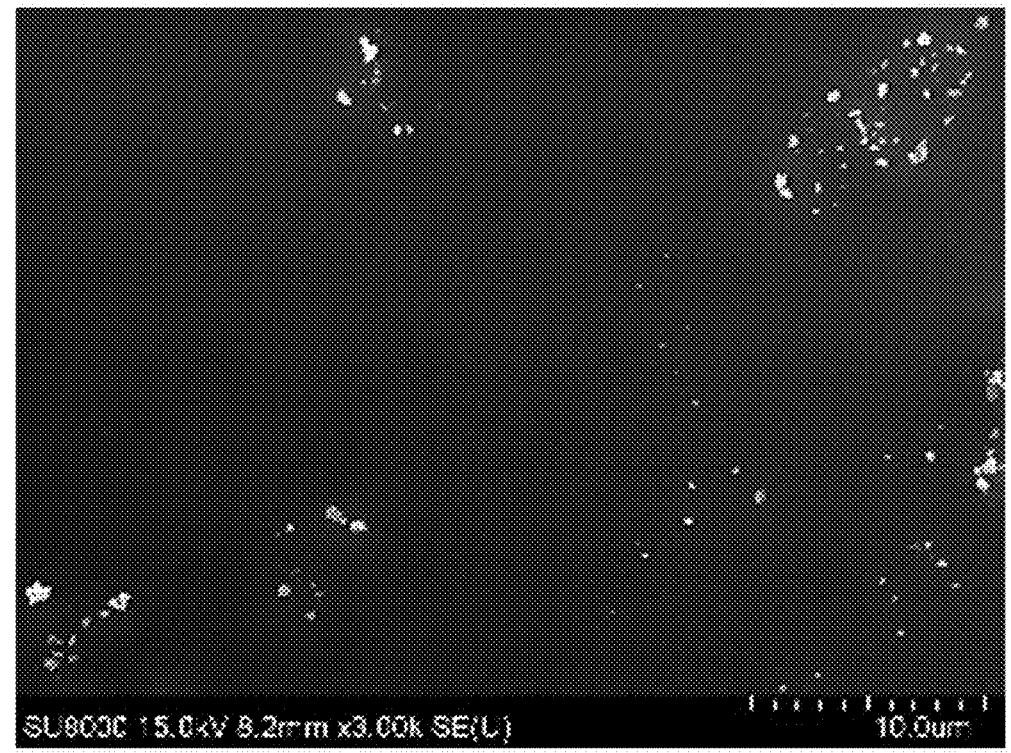
FIG. 4 is a diagram showing an SEM image of Example 2.
Figure 5:
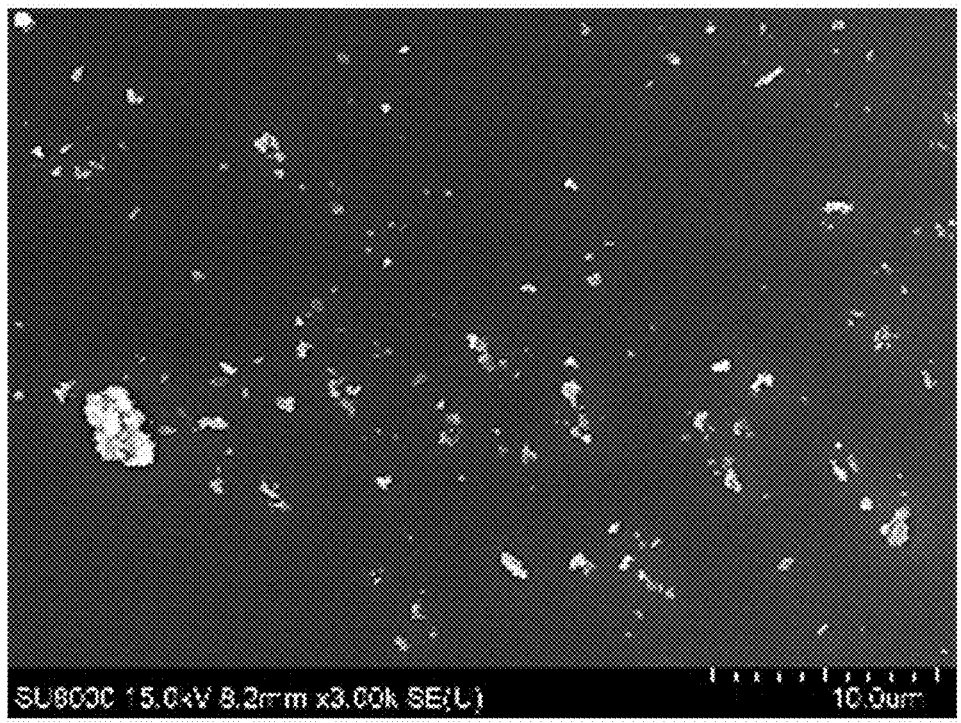
FIG. 5 is a diagram showing an SEM image of Comparative Example 1.
Figure 6:
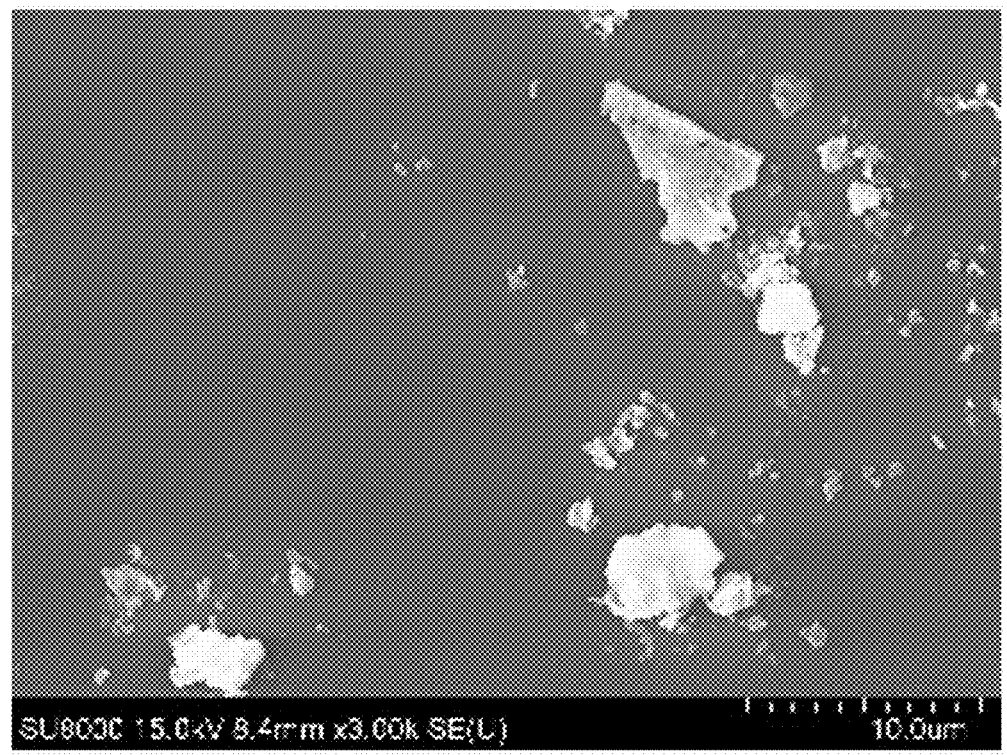
FIG. 6 is a diagram showing an SEM image of Comparative Example 2.
Figure 7:
FIG. 7 is a diagram showing an SEM image of Example 1.
Figure 8:
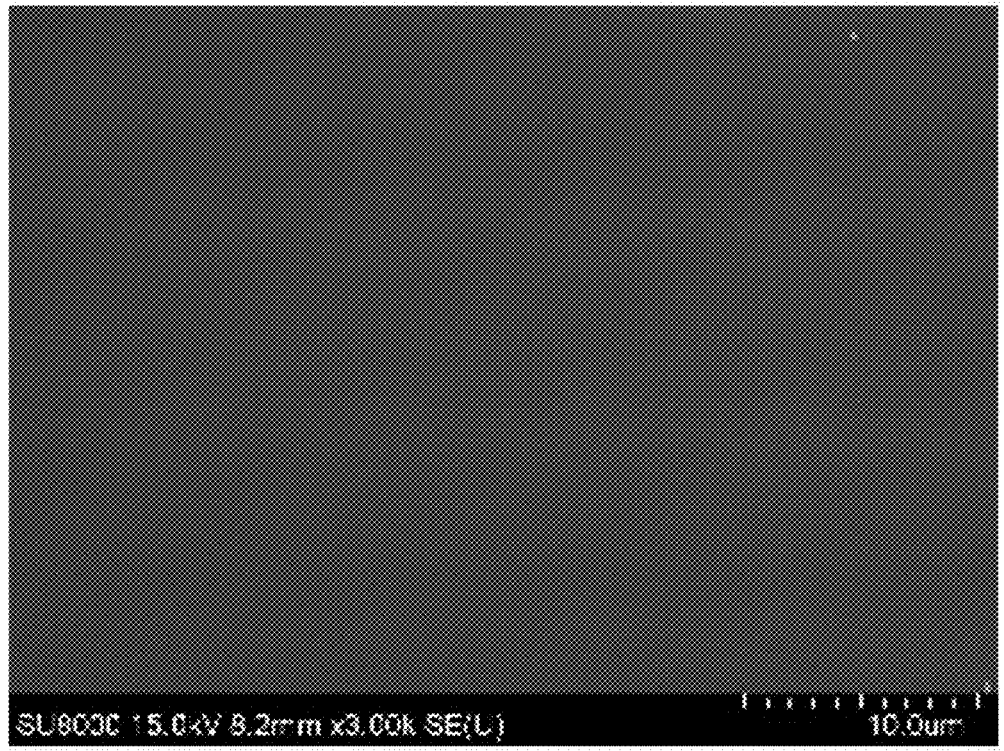
FIG. 8 is a diagram showing an SEM image of Example 2.
Figure 9:
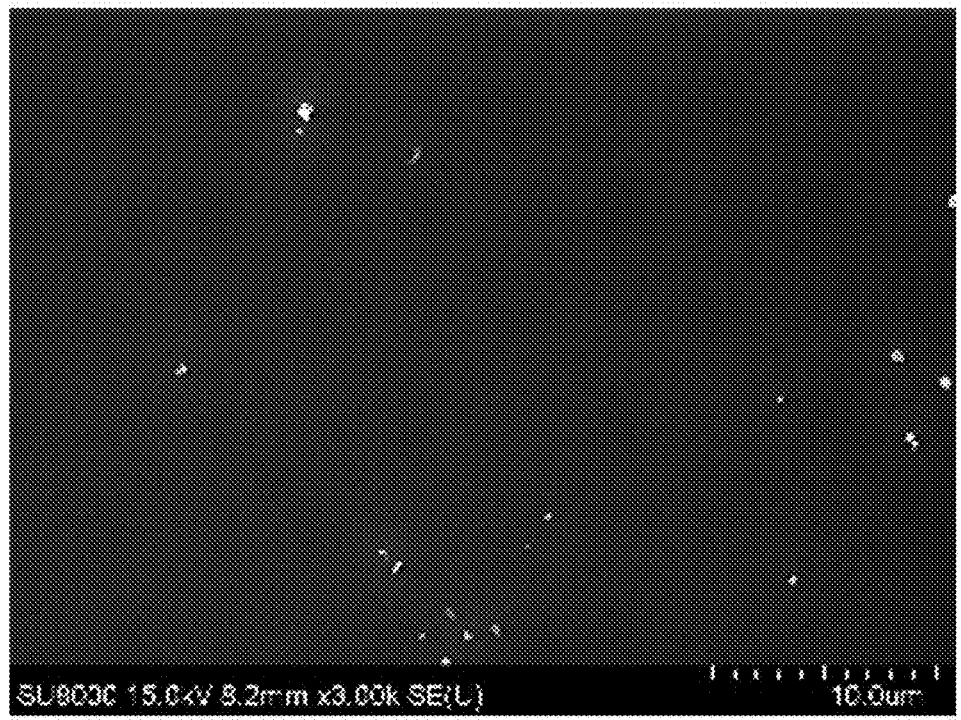
FIG. 9 is a diagram showing an SEM image of Comparative Example 1.
Figure 10:
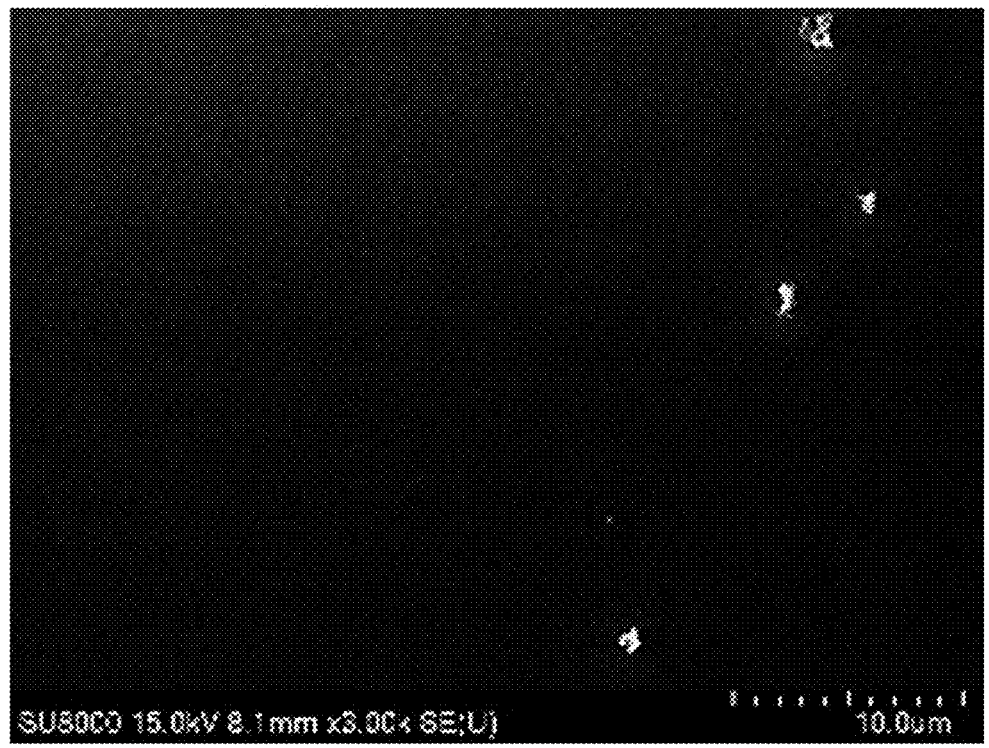
FIG. 10 is a diagram showing an SEM image of Comparative Example 2.

A method of calculating the critical surface tension of the substrate based on the Zisman plot method is as follows. FIG. 2 is a diagram for explaining an outline of the Zisman plot method.

For example, in a case where a plurality of measuring liquids 1 to 3 having different surface tensions are used, a contact angle (°) with respect to the surface of each substrate is measured, and the cosine (COS) of the contact angle of each liquid is plotted with respect to the surface tension of each liquid to obtain a straight line shown in FIG. 2. Subsequently, the surface tension when the cosine on the straight line becomes 1.0 (completely wet state) is obtained as critical surface tension (mN/m) of the substrate surface of the substrate to be measured.

Even in a case where two or four or more kinds of measuring liquids are used, the critical surface tension can be measured in the same manner as the case of using the three kinds.

In the present embodiment, a substrate having the silicon oxide film after the treatment (1) and a substrate having the silicon nitride film after the treatment (3) were used as substrates, and the measuring liquids were used, and an environmental temperature of the contact angle and a measuring liquid temperature were set to 25° C.

However, in a case where the critical surface tension could not be measured since all droplets of the measuring liquid were wet and spread, the critical surface tension was set to 72.0 [mN/m], which is the same as the surface tension of water. The critical surface tension in this case was denoted as "*" in Table 1.

TABLE 1

| | | | Example 1 Experimental Example 1 A | Example 2 Experimental Example 2 B | Comparative Example 1 Experimental Example 3 C | Comparative Example 2 Experimental Example 4 D |
|---|---|---|---|---|---|---|
| | Treatment agent composition | Unit | | | | |
| Surface modification index Y | Critical surface tension of $SiO_2$ film | mN/m | 21.0 | 23.9 | 45.9 | 72.0 (*) |
| Surface modification index Z | Critical surface tension of SiN film | mN/m | 24.3 | 25.2 | 25.2 | 25.2 |

TABLE 1-continued

| Treatment agent composition | | | Unit | Example 1 Experimental Example 1 A | Example 2 Experimental Example 2 B | Comparative Example 1 Experimental Example 3 C | Comparative Example 2 Experimental Example 4 D |
|---|---|---|---|---|---|---|---|
| Y/Z | | | | 0.86 | 0.95 | 1.82 | 2.86 |
| Adhesion property of foreign substances | Residual amount of alumina particles | SiO₂ film | | A | A | B | — |
| | | SiN film | | A | A | B | — |

Based on the measurement result of "Y/Z" representing the ratio of the "surface modification index Y" to the obtained "surface modification index Z", the treatment agent compositions A and B of Experimental Examples 1 and 2 were used in Example 1 and 2, and the treatment agent compositions C and D of Experimental Examples 3 and 4 were used as Comparative Examples 1 and 2.

The obtained treatment agent composition of each of Examples and Comparative Examples was evaluated based on the following evaluation items. The evaluation results are shown in Table 1.

Evaluation of Adhesion Property of Foreign Substances (1) A substrate A having a silicon oxide film (SiO$_2$ film) having a thickness of 1 μm on the surface and a substrate B having a silicon nitride film (SiN film) having a thickness of 50 nm on the surface were prepared.

(2) The substrate A and the substrate B of (1) were immersed in a 1% by mass hydrofluoric acid aqueous solution at room temperature for 10 minutes, and subsequently were immersed in pure water for 1 minute to perform cleaning.

(3) An aqueous dispersion of alumina particles was applied onto the surfaces of the substrate A and the substrate B cleaned in (2), and subsequently the substrate A and the substrate B were immersed in iPA for 1 minute.

(4) The substrate A and the substrate B obtained in (3) were immersed in each treatment agent compositions obtained in Experimental Examples 1 to 4 at 25° C. for 1 minute, and subsequently immersed in iPA for 1 minute.

(5) After (4), the substrate A and the substrate B were removed from the iPA and air was blown to remove the iPA on the surface of the substrate.

The surfaces of the substrate A and the substrate B obtained in (1) to (5) were observed using an SEM, and a residual amount of alumina particles was evaluated based on the obtained SEM images.

The SEM images on the substrates A of Examples 1 and 2 and Comparative Examples 1 and 2 are shown in FIGS. 3 to 6, respectively, and the SEM images on the substrates B of Examples 1 and 2 and Comparative Examples 1 and 2 are shown in FIGS. 7 to 10, respectively. The white moiety in FIGS. 3 to 10 shows the alumina particles remaining on the surface of the substrate.

As a result of the obtained SEM images, in a case where the treatment agent compositions of Examples 1 and 2 were used in each of the substrate A and the substrate B, it was shown that the amount of residual alumina could be reduced as compared with Comparative Examples 1 and 2.

In Table 1, the residual amount of alumina in Comparative Example 2 was denoted as "-", a case where the amount was reduced compared to the standard was denoted as "A", and a case where the amount was equal to or higher than the standard was denoted as "B".

In a case where the treatment agent compositions of Examples 1 and 2 were used, almost no adhesion of agglomerates of alumina particles was observed on the substrate A and the substrate B.

From the above description, it was found that the treatment agent compositions of Examples 1 and 2 are excellent in the property of preventing adhesion of particles such as metal particles as compared with Comparative Examples 1 and 2. It is expected that such treatment agent compositions of Examples 1 and 2 are suitably used as a bevel portion treatment agent composition for treating a bevel portion of a semiconductor wafer.

This application claims priority on the basis of Japanese Patent Application No. 2018-218942 filed on Nov. 22, 2018 and incorporates all of its disclosures herein.

The invention claimed is:

1. A method of manufacturing a wafer having a bevel portion, comprising:
   a wafer surface modification step; and
   a wafer processing step, wherein
      the wafer processing step includes at least one step selected from the group consisting of a step of forming a fine pattern having an uneven shape in the element forming region on the wafer, a step of dicing or grinding the wafer, a step of forming an insulating film and/or a metal film, and a step of cleaning the wafer, and
      the wafer surface modification step is performed before and after the wafer processing step and between each of a plurality of steps during the processing step
      in the surface modification step, a bevel portion treatment agent composition which is useful for treating a bevel portion of a wafer is applied to the bevel portion, the composition comprising:
   a silylating agent,
   wherein the composition has properties such that a surface modification index Y and a surface modification index Z as measured in the following procedures (1) to (4) satisfy $0.5 \leq Y/Z \leq 1.0$,
   (1) a substrate having a silicon oxide film (SiO$_2$ film) having a thickness of 1 μm on a surface is treated with the bevel portion treatment agent composition, under treatment conditions of: the substrate is immersed in 1% by mass of a hydrofluoric acid aqueous solution at room temperature for 10 minutes, subsequently, immersed in pure water for 1 minute, and in 2-propanol (iPA) for 1 minute, subsequently, immersed in the bevel portion treatment agent composition at 25° C. for 1 minute, subsequently, immersed in iPA for 1 minute, finally the substrate was removed from the iPA, and air is blown to remove the iPA on the surface of the substrate, (2) a critical surface tension of the silicon oxide film after the treatment (1) is obtained by a Zisman plot method using a plurality of measuring liquids having different mixing ratios of water and iPA, and a value of the obtained critical surface tension (mN/m) is defined as the "surface modification index Y", (3) a substrate having a silicon nitride film (SiN film) having a thickness of 50 nm on a surface is treated with the bevel portion treatment agent composition, under treatment conditions of: the substrate is immersed in 1% by mass of a hydrofluoric acid aqueous solution at room temperature for 10 minutes, subsequently, immersed in pure water for 1 minute, and in iPA for 1 minute, subsequently, immersed in the bevel portion treatment agent composition at 25° C. for 1 minute, subsequently, immersed in iPA for 1 minute, finally, the substrate is removed from iPA, and air is blown to remove iPA on the surface of the substrate, and (4) a critical surface tension of the silicon nitride film after the treatment (3) is obtained by the Zisman plot method using a plurality of measuring liquids having different mixing ratios of water and iPA, and an obtained value (mN/m) of the critical surface tension is defined as the "surface modification index Z".

2. The method of manufacturing the wafer according to claim 1, wherein the insulating film is a heterogenous film that is exposed on the surface of the bevel portion in a state where a plurality of heterogenous materials is mixed.

3. The method of manufacturing the wafer according to claim 1, wherein the insulating film includes a silicon oxide film and a silicon nitride film.

4. The method of manufacturing the wafer according to claim 1, wherein in the wafer surface modification step, the bevel portion treatment agent composition is used within 30 minutes after its preparation.

5. The method of manufacturing the wafer according to claim 1, wherein in the wafer surface modification step, the bevel portion treatment agent composition is prepared at a liquid temperature of 25° C.

\* \* \* \* \*